(12) United States Patent
Willwohl et al.

(10) Patent No.: US 9,593,810 B2
(45) Date of Patent: Mar. 14, 2017

(54) LED PACKAGE AND METHOD FOR MANUFACTURING THE LED PACKAGE

(75) Inventors: Harald Willwohl, Aachen (DE); Norbertus Antonius Maria Sweegers, Lierop (NL); Jan Kloosterman, Esch (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 896 days.

(21) Appl. No.: 12/678,321

(22) PCT Filed: Sep. 16, 2008

(86) PCT No.: PCT/IB2008/053744
§ 371 (c)(1),
(2), (4) Date: Jun. 21, 2010

(87) PCT Pub. No.: WO2009/037634
PCT Pub. Date: Mar. 26, 2009

(65) Prior Publication Data
US 2010/0284198 A1    Nov. 11, 2010

(30) Foreign Application Priority Data
Sep. 20, 2007    (EP) .................................... 07116835

(51) Int. Cl.
*H05K 1/00*    (2006.01)
*F21K 99/00*    (2016.01)
(Continued)

(52) U.S. Cl.
CPC ............... *F21K 9/00* (2013.01); *F21S 48/115* (2013.01); *F21S 48/1154* (2013.01);
(Continued)

(58) Field of Classification Search
CPC ... H01L 29/7851; H01L 33/62; H01L 21/283; H01L 23/544
(Continued)

(56) References Cited

U.S. PATENT DOCUMENTS 6,023,104 A    2/2000  Koizumi et al.
6,496,270 B1 *  12/2002 Kelley et al. ................. 356/602
(Continued)

FOREIGN PATENT DOCUMENTS

EP    1326112 A2    7/2003
JP    06188458 A    7/1994
(Continued)

OTHER PUBLICATIONS

EPO as ISA, PCTIB2008/053744, filed Sep. 16, 2008, "International Search Report and Written Opinion", mailed Apr. 28, 2009, 16 pages.
(Continued)

*Primary Examiner* — Sean Gramling
*Assistant Examiner* — Gerald J Sufleta, II
(74) *Attorney, Agent, or Firm* — Patent Law Group LLP; Brian D. Ogonowsky

(57) ABSTRACT

A LED package (10) for use in a lamp as well as a method for manufacturing such kind of a LED package (10) are provided, wherein the LED package (10) comprises at least one LED (16), an optical element (18) for guiding light emitted by the LED (16), a cover (26) for covering at least partially electrical components (20, 22, 24) connectable to the LED (16) and at least one optical detectable reference mark (32; 36), wherein the optical element (18) comprises at least one first optical detectable mark (30) and the cover (26) comprises at least one second optical detectable mark (34), whereby the optical element (18) and the cover (26) are arranged and aligned both with respect to the same reference
(Continued)

mark (32; 36) by means of the first mark (30) and the second mark (34). Due to the same reference (32; 36) for both the optical element (18) and the cover (26) manufacturing tolerances are not added to each other so that the accuracy of a correct arrangement is increased. Thus, the LED package (10) provides an improved optical performance, particularly an improved brightness and an improved luminous flux.

18 Claims, 2 Drawing Sheets

(51) Int. Cl.
  *F21S 8/10* (2006.01)
  *H05K 1/02* (2006.01)
  *H05K 3/30* (2006.01)
  *F21Y 101/00* (2016.01)

(52) U.S. Cl.
  CPC ......... *F21S 48/215* (2013.01); *F21Y 2101/00* (2013.01); *H05K 1/0269* (2013.01); *H05K 3/303* (2013.01)

(58) Field of Classification Search
  USPC ............... 362/294, 311.02, 249.02; 257/797
  See application file for complete search history.

(56) References Cited

U.S. PATENT DOCUMENTS

| | | | |
|---|---|---|---|
| 6,590,235 B2 | 7/2003 | Carey et al. | |
| 7,078,728 B2 | 7/2006 | Ishii et al. | |
| 7,208,772 B2 | 4/2007 | Lee et al. | |
| 7,244,965 B2 | 7/2007 | Andrews et al. | |
| 2003/0207479 A1* | 11/2003 | Border et al. | 438/22 |
| 2004/0120632 A1 | 6/2004 | Simms | |
| 2006/0211168 A1 | 9/2006 | Ormond et al. | |
| 2006/0289975 A1* | 12/2006 | Aizpuru | H01L 23/49541 257/676 |
| 2007/0110361 A1* | 5/2007 | Harden et al. | 385/14 |
| 2007/0178612 A1* | 8/2007 | Bradl | H01L 23/544 438/14 |
| 2007/0241357 A1* | 10/2007 | Yan | 257/98 |
| 2008/0179614 A1* | 7/2008 | Wang et al. | 257/98 |
| 2008/0254557 A1* | 10/2008 | Kim et al. | 438/27 |
| 2008/0283861 A1* | 11/2008 | Loh et al. | 257/98 |
| 2009/0002994 A1* | 1/2009 | Yoneda et al. | 362/294 |
| 2009/0059594 A1* | 3/2009 | Lin | 362/294 |
| 2009/0108281 A1* | 4/2009 | Keller et al. | 257/98 |
| 2009/0136237 A1* | 5/2009 | Martini et al. | 398/141 |

FOREIGN PATENT DOCUMENTS

| | | |
|---|---|---|
| JP | 2004311861 A | 11/2004 |
| JP | 2007019133 A | 1/2007 |

OTHER PUBLICATIONS

First Office Action, China Application No. 200880107996.9, dated Mar. 10, 2011, 9 pages.
Grant Notification, China Application No. 200880107996.9 dated Sep. 23, 2011, 3 pages.
Office Action, European Application No. 08807671.6, dated Mar. 18, 2014, 4 pages.
Office Action, Taiwan Application No. 097135635, dated Jun. 13, 2014, 6 pages.

\* cited by examiner

LED PACKAGE AND METHOD FOR MANUFACTURING THE LED PACKAGE

FIELD OF THE INVENTION

The invention relates to the field of LED packages, which may be used in motor vehicle lamps to provide light by means of at least one light emitting diode (LED) of the LED package. The invention relates further to a method, by which such kind of a LED package may be manufactured.

BACKGROUND OF THE INVENTION

From U.S. Pat. No. 6,023,104 A a LED package is known, which is received by arranging several LED arrays each comprising an alignment mark onto a common printed circuit board comprising a reference mark, wherein this arrangement is performed by adjusting the alignment marks with respect to the same reference mark by means of an optical comparison.

It is a disadvantage of such kind of a LED package that in more demanding arrangements, when additional parts, like optical elements or covers, are provided, the optical performance of the LED package may be affected. Particularly the brightness and the luminous flux of the LED package are affected.

SUMMARY OF THE INVENTION

It is an object of the invention to provide a LED package, which provides an improved optical performance, particularly an improved brightness and an improved luminous flux, as well as a method to manufacture such kind of a LED package.

This object is achieved by a LED package for use in a lamp comprising at least one LED, an optical element for guiding light emitted by the LED, a cover for covering at least partially electrical components connectable to the LED and at least one optical detectable reference mark, wherein the optical element comprises at least one first optical detectable mark and the cover comprises at least one second optical detectable mark, whereby the optical element and the cover are arranged and aligned both with respect to the same reference mark by means of the first mark and the second mark.

Due to the marks of the optical element and the cover it is not necessary to arrange and align the cover with respect to the optical element, which is arranged and aligned for instance with respect to the LED, but to arrange and align the optical element and the cover both with respect for instance to the LED. Due to the same reference for both the optical element and the cover manufacturing tolerances are not added to each other so that the accuracy of a correct arrangement is increased. Particularly manufacturing tolerances may compensate each other. Although several different parts of the LED package are provided, which normally may affect the brightness and/or the luminous flux of the light leaving the LED package due to manufacturing tolerances leading to scattered light, a significant rise of scattered light is prevented. Particularly it is possible to perform the positioning of the optical element and the cover by means of the same optical system. Thus, a higher manufacturing accuracy and an improved optical performance may be provided without the need for additional manufacturing apparatuses. An adapted control software for already existing manufacturing machines is sufficient to manufacture the LED package according to the invention. The quality of the LED package is improved at low costs. Further the optical element and the cover are two-piece so that different materials may be selected. For instance the material of the optical element is chosen with respect to high heat resistance and good optical properties, wherein it is not necessary to chose the same material for the cover, since the cover may be arranged spaced to the LED and/or the optical element without affecting the optical performance of the LED package.

Particularly it is possible to increase the accuracy effect by providing additional parts of the LED package with marks for arranging and aligning this part with respect to the same reference mark. Preferably a substrate is provided, onto which the LED is arranged, wherein the substrate comprises the reference mark or the substrate comprises at least one third optical detectable mark for arranging and aligning the substrate with respect to the same reference mark. Since the LED may be fixed to the substrate it is sufficient, when the substrate comprises the reference mark in order to position the optical element and the cover accurately with respect to the LED. Particularly a heat sink for leading away heat from the LED may be provided, to which the LED is thermally connected, wherein the heat sink comprises the reference mark or the heat sink comprises at least one forth optical detectable mark for arranging and aligning the heat sink with respect to the same reference mark. Preferably the LED or a lighting field element comprising the LED comprises at least one fifth optical detectable mark for arranging and aligning the LED or the lighting field element with respect to the same reference mark. The lighting element may comprise several LEDs arranged in regular pattern, wherein the LEDs may be provided onto a common substructure comprising the reference mark.

In a preferred embodiment between the cover and the LED and/or the optical element a thermal barrier, particularly a gap, is provided. Due to the high thermal insulation it is not necessary to choose the material of the cover with respect to a high heat resistance so that the cover may be manufactured for example of a thermoplastic material by injection molding. Particularly the cover comprises a lower heat resistance than the heat resistance of the optical element.

Preferably the cover comprises at least one alignment element, particularly three alignment elements, more particularly alignment protrusions, for aligning the cover with respect to a housing of a lamp. The alignment protrusions may abut the housing so that a correct alignment of the LED package with respect to the housing is performed by the alignment protrusions. Thus, an alignment perpendicular to the plane of the reference marks is provided. An alignment in three orthogonal directions may be realized.

The cover may comprise at least one, particularly tapered, connection opening for connecting the cover via the connection opening particularly by laser welding. By means of the connection openings it is possible to fix the cover to a structure like the substrate or the heat sink without moving the cover relative to the structure. Thus, a fixation is possible without affecting the alignment.

The invention further relates to a lamp, particularly headlight or taillight for motor vehicles, comprising a LED package, which may be designed as previously described, and a housing, to which the LED package is connected via the cover. Since the necessary alignment of the LED is performed during the manufacturing of the LED package the assembling of the LED package into the lamp may be facilitated. For instance it is sufficient to provide a snap connection between the cover of the LED package and the housing of the lamp to provide an accurate alignment of the LED package.

Preferably the housing comprises at least one referencing features for mounting at least one secondary optics element such as lenses or collimators adjacent to the optical element. The secondary optics element may be part of a lens system, so that the light emitted from the LED package may be focused as desired. Since the LED package is connected to the housing, an exact positioning of the LED package with respect to housing is possible so that the secondary optics element(s) may be arranged very accurate with respect to the optical element of the LED package. Preferably the secondary optics element is arranged close to the optical element so that mainly all emitted light is collected by the secondary optics element.

The invention relates further to a method of manufacturing a LED package as previously described, wherein a reference mark is provided at the LED package, particularly at the substrate or the heat sink, the optical element is arranged and aligned with respect to the reference mark via the first optical detectable mark by means of an optical system and the cover is arranged and aligned with respect to the same reference mark via the second optical detectable mark by means of the optical system.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
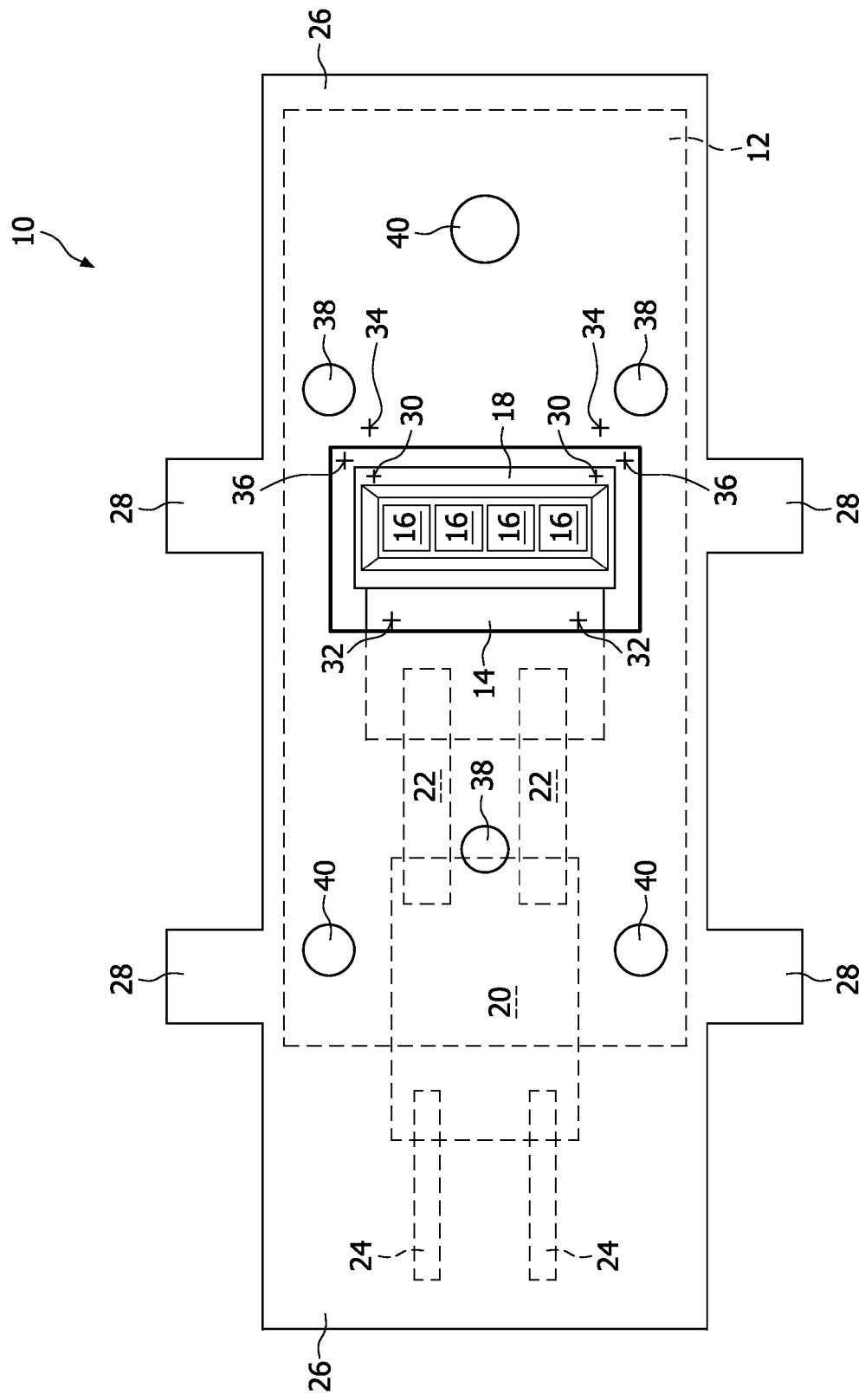
FIG. 1 is a schematic top view of the LED package according to the invention and FIG. 2 is a schematic sectional view of the LED package of FIG. 1.

The LED package 10 illustrated in FIG. 1 comprises a heat sink 12, which may be a copper plate or the like. A substrate 14 is thermally and mechanical connected to the heat sink 12. Four LEDs 16 arranged in a line are fixed to the substrate 14. The LEDs 16 are surrounded by an optical element 18, which may be a collimator comprising a reflective coating for collecting and guiding light emitted by the LEDs 16.

The optical element 18 is aligned in close vicinity to the LEDs 16. Preferably the optical element 18 comprises a material of high specular or diffuse reflectivity and a high temperature resistance. The coefficient of reflection may be ≥85%, preferably ≥90% and most preferred ≥95%. This material may comprise a good long term stability above 150° C. A high temperature plastics material such as LCP filled with $TiO_2$ or $Al_2O_3$ particles may be used as material with a high diffuse reflectivity.

Further a printed circuit board (PCB) 20 is provided to control the LEDs 16. The PCB 20 is connected to the LEDs 16 via connecting means 22, which are connected to not illustrated lines arranged on the substrate 14. Connectors 24 are connected to the PCB 20 for applying an electrical source. Preferably a direct electrical connection between the connectors 24 and the substrate 14 is established. Most preferred this electrical connection is performed by a laser welding joint of the connectors 24 to a conductive layer of the substrate 14.

A cover 26 covers the connectors 24, the PCB 20, the connecting means 20 and most of the substrate 14 as well as the heat sink 12. The cover comprises projections 28, by means of which the LED package 10 may by fastened to a housing of a lamp. Due to the projections 28 the LED package may be accurate positioned relative to the housing, a lens system or the like. For example the protrusions 28 may be spring-loaded received by a recess of such kind of a housing, so that a definite and accurate alignment of the LED package is provided.

The optical element 18 comprises two first marks 30, which are optical detectable by an optical system for providing a correct arrangement and alignment with respect to two reference marks 32, which are provided at the substrate 14 in the illustrated embodiment. The cover 26 comprises two second optical detectable marks 34, by means of which the cover 26 is arranged and aligned with respect to the same reference marks 32 of the substrate 14. In an alternate embodiment the marks 32 may be third optical detectable marks 32 for arranging and aligning the substrate 14 as well as the LEDs 16 fixed to the substrate 14 with respect to reference marks arranged somewhere else, for example on the heat sink 12, wherein the optical element 18 and the cover 26 are positioned with respect to the same reference mark. The heat sink 12 may comprise two fourth optical marks 36 so that the substrate 14 and the heat sink 12 may be correctly positioned with respect to each other via the same reference mark 32.

Figure 2:
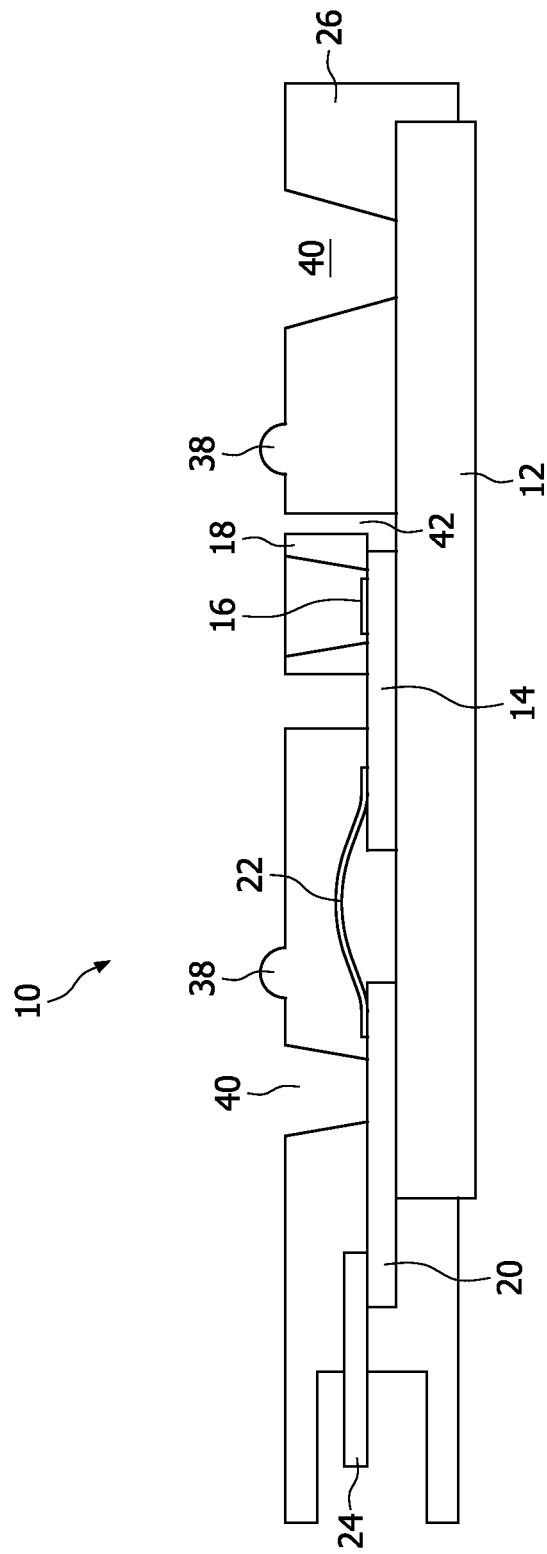

The cover 26 further comprises three alignment protrusions 38, which protrude to the same level (FIG. 2), so that the LED package 10 may be positioned at a correct height at a housing of a motor vehicle lamp or an external optical system such as a reflector or a projector system. For that purpose the LED package 10 may be spring loaded, for instance via the heat sink 12, so that all three alignment protrusions 38 are in contact to the housing in assembled state. Further the cover 26 comprises three tapered connection openings 40 so that the cover 26 may be connected to the heat sink 12 via laser welding or the like. Between the cover 26 and the optical element 18 is a gap 42 provided. The gap 42 provides a thermal barrier, so that the heat emitted by the LEDs 16 and conducted to the optical element 18 is mainly not conducted to the cover 26.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the forth mark 36 of the heat sink 12 is the reference mark instead of the mark 32 of the substrate 14. Further the LEDs 16 may comprise forth optical detactable marks or the LEDs may be connected to common substructure of a separate lighning field connected to the substrate 14, wherein the lighting field, particularly the substructure, like a thin film layer, may comprise the forth marks for arranging and aligning the LEDs 16 with respect to the same reference mark 32. Further the marks 30, 32, 34, 36 may not only be designed cross-like. The marks 30, 32, 34, 36 may have any suitable design sufficient to compare two different marks 30, 32, 34, 36 by optical techniques for alignment to each other in two different directions.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A device comprising an LED package, the LED package comprising:
   at least one LED mounted over a base;
   an optical element mounted over the LED and over the base, the optical element configured to guide light emitted by the LED;
   a cover mounted over the base and at least partially covering electrical components connected to the LED, wherein the cover is laterally spaced from the optical element to create a gap between the cover and the optical element; and
   a plurality of optically detectable reference marks on the base that remain optically detectable within the gap after the optical element and the cover are positioned,
   wherein the optical element includes a plurality of first optically detectable marks that are optically detectable along with the reference marks on the base within the gap, and the cover includes a plurality of second optically detectable marks that are optically detectable along with the reference marks on the base within the gap, wherein both the optical element and the cover are arranged and aligned with respect to the same optically detectable reference marks on the base via the first optically detectable marks and the second optically detectable marks, respectively,
   wherein the cover further comprises at least three alignment protrusions on its top surface, forming the highest points of the LED package, for concurrently contacting a reference surface during positioning of the package in a housing for positioning the package at a correct height in the housing.

2. The device of claim 1, wherein the base comprises a substrate onto which the LED is mounted.

3. The device of claim 1, wherein the base comprises a heat sink configured to lead heat away from the LED.

4. The device of claim 1, wherein the LED or a lighting field element comprising the LED includes at least one additional optically detectable mark for arranging and aligning the LED or the lighting field element with respect to the same optically detectable reference marks.

5. The device of claim 1, wherein a thermal barrier is provided between the cover and at least one of the LED and the optical element.

6. The device of claim 1, wherein the cover has a heat resistance which is less than a heat resistance of the optical element.

7. The device of claim 1, wherein the cover comprises at least one tapered, connection opening for connecting the cover via the connection opening.

8. The device of claim 1, comprising a housing to which the LED package is connected via the cover, wherein the housing comprises at least one lens arranged adjacent to the optical element.

9. The device of claim 1, wherein at least one of the optically detectable reference marks, the first optically detectable marks, and the second optically detectable marks have a shape of a cross.

10. The device of claim 1, wherein the optically detectable reference marks have a shape of a cross.

11. A method of manufacturing and positioning a LED package, comprising:
    providing at least one LED mounted over a base;
    mounting an optical element over the LED and over the base, the optical element configured to guide light emitted by the LED, the optical element including a plurality of first optically detectable marks;
    mounting a cover over the base, the cover at least partially covering electrical components connected to the LED, the cover including a plurality of second optically detectable marks, wherein the cover is laterally spaced from the optical element to create a gap between the cover and the optical element;
    providing a plurality of optically detectable reference marks on the base that remain optically detectable within the gap after the optical element and the cover are positioned;
    wherein mounting the optical element comprises arranging and aligning the optical element with respect to the optically detectable reference marks within the gap via the first optically detectable marks by means of an optical system;
    wherein mounting the cover comprises arranging and aligning the cover with respect to the same optically detectable reference marks via the second optically detectable marks by means of the optical system, such that the optically detectable reference marks remain optically detectable after the optical element and the cover are mounted over the base; and
    wherein the cover further comprises at least three alignment protrusions on its top surface, forming the highest points of the LED package, the method further comprising positioning the package in a housing such that the three alignment protrusions concurrently contact a reference surface in the housing for positioning the package at a correct height in the housing.

12. The method of claim 11, wherein at least one of the optically detectable reference marks, the first optically detectable marks, and the second optically detectable marks have a shape of a cross.

13. The method of claim 11, wherein the optically detectable reference marks have a shape of a cross.

14. An LED package, comprising:
    a substrate;
    at least one LED arranged on the substrate;
    a heat sink configured to lead heat away from the LED, the heat sink being thermally connected to the LED;
    an optical element mounted over the LED and configured to guide light emitted by the LED, the optical element having a plurality of first optically detectable marks provided thereon; and
    a cover at least partially covering electrical components connected to the LED, the cover having a plurality of second optically detectable marks provided thereon, wherein the cover is laterally spaced from the optical element to create a gap between the cover and the optical element;
    wherein one of the substrate and the heat sink has a plurality of optically detectable reference marks provided thereon,
    wherein both the optical element and the cover are arranged and aligned with respect to the same optically detectable reference marks within the gap via the first optically detectable marks and the second optically detectable marks, respectively, such that the optically detectable reference marks remain optically detectable after the optical element and the cover have been arranged and aligned with respect to the same optically detectable reference marks, and wherein the cover further comprises at least three alignment protrusions on its top surface, forming the highest points of the LED package, for concurrently contacting a reference surface during positioning of the package in a housing for positioning the package at a correct height in the housing.

15. The LED package of claim 14, wherein the substrate has the optically detectable reference marks provided thereon.

16. The LED package of claim 14, wherein the heat sink has the optically detectable reference marks provided thereon.

17. The LED package of claim 14, wherein at least one of the optically detectable reference marks, the first optically detectable marks, and the second optically detectable marks have a shape of a cross.

18. The LED package of claim 14, wherein the optically detectable reference marks have a shape of a cross.

* * * * *